United States Patent
Shinbo et al.

(10) Patent No.: US 7,279,991 B2
(45) Date of Patent: Oct. 9, 2007

(54) SEMICONDUCTOR INTEGRATED CIRCUIT WITH PLL CIRCUIT

(75) Inventors: Jiro Shinbo, Takasaki (JP); Satoshi Arayashiki, Isesaki (JP); Hirotaka Oosawa, Isesaki (JP); Toshiya Uozumi, Takasaki (JP); Satoru Yamamoto, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 56 days.

(21) Appl. No.: 11/178,565

(22) Filed: Jul. 12, 2005

(65) Prior Publication Data

US 2006/0012442 A1 Jan. 19, 2006

(30) Foreign Application Priority Data

Jul. 13, 2004 (JP) ............................. 2004-205452

(51) Int. Cl.
*H03L 7/00* (2006.01)
(52) U.S. Cl. .......................................... 331/17; 331/16
(58) Field of Classification Search ................... 331/17
See application file for complete search history.

(56) References Cited

U.S. PATENT DOCUMENTS

2002/0042256 A1* 4/2002 Baldwin et al. .......... 455/232.1
2005/0110537 A1* 5/2005 Wurzer ...................... 327/156
2005/0239499 A1* 10/2005 Oosawa et al. .......... 455/552.1

FOREIGN PATENT DOCUMENTS

JP 9-331251 12/1997

* cited by examiner

*Primary Examiner*—Joseph Chang
(74) *Attorney, Agent, or Firm*—Mattingly, Stanger, Malur & Brundidge, P.C.

(57) ABSTRACT

In a PLL circuit including an oscillator, a phase comparator, a charge pump circuit, and a loop filter, without providing a plurality of capacitative elements, that is, without increasing the occupied area so much, the characteristics of the PLL circuit can be adjusted according to manufacture variations in a resistive element and a capacitative element, and a loop filter can be formed on a chip. A resistive element and a capacitative element of a loop filter are formed on a semiconductor chip. As the resistive element, a plurality of elements having different resistance values are provided and switched by a switch, thereby enabling the resistance value to be adjusted. Current in a charge pump circuit is also made adjustable, and the current of the charge pump circuit is adjusted according to switching among the resistance values of the resistive elements.

10 Claims, 5 Drawing Sheets

SEMICONDUCTOR INTEGRATED CIRCUIT WITH PLL CIRCUIT

CROSS-REFERENCE TO RELATED APPLICATION

The present application claims priority from Japanese patent application No 2004-205452 filed on Jul. 13, 2004, the content of which is hereby incorporated by reference into this application.

BACKGROUND OF THE INVENTION

The present invention relates to a PLL (Phase Locked Loop) circuit including a voltage-controlled oscillator (VCO) and, more particularly, to a technique effective when applied to the case where a filter on a PLL loop is provided in a semiconductor chip. The invention relates to, for example, a technique effective for use in a PLL circuit which is provided in a semiconductor integrated circuit for high frequencies for modulating or up-converting a transmission signal in a radio communication device such as a cellular phone.

A radio communication device (mobile communication device) typified by a cellular phone is generally constructed by: a semiconductor integrated circuit (generally, called RF IC) having the function of up-converting and modulating a transmission signal and down-converting and demodulating a reception signal; a semiconductor integrated circuit (baseband IC) having the function of converting transmission data to I and Q signals and reconstructing reception data from demodulated I and Q signals; an electronic part called a power module including a high-frequency power amplifier, a bias circuit for the power amplifier, and an impedance matching circuit; and an electronic part called a front-end module including a transmission/reception switching circuit, a low-pass filter, and an impedance matching circuit.

In recent years, in order to reduce the size and cost of a radio communication device by decreasing the number of parts, efforts are being made to provide circuits as many as possible in one or a few semiconductor integrated circuits. As one of them, an attempt is made to form resistive elements and capacitive elements as components of a loop filter provided on a PLL in an RF IC onto a semiconductor chip.

As it is known, however, in the present semiconductor integrated circuit manufacturing technique, variations in the resistive elements and capacitive elements formed on a semiconductor chip are large, and there is a problem such that the characteristics of the loop filter are deviated from desired characteristics. Consequently, in a conventional RF IC, a loop filter is generally constructed by external resistive elements and external capacitative elements, and it is one of factors disturbing miniaturization. An invention has been proposed in which, for miniaturization of an oscillation circuit, resistive and capacitative elements as components of a loop filter are formed on a semiconductor chip and an element to be used is switched by a switch so that the characteristics of the filter can be adjusted (Japanese Unexamined Patent Publication No. Hei 09(1997)-331251).

SUMMARY OF THE INVENTION

In the conventional technique of preliminarily forming a plurality of resistive elements and a capacitative element on a semiconductor chip and adjusting the characteristics of a filter, particularly, the size of the capacitative element as a component of a loop filter is large, so that the area occupied by the filter is large. It causes a problem such that the chip size increases and the unit price of a chip rises.

There is a method of providing, as the capacitative element, a plurality of capacitative elements corresponding to the difference from a basic capacitative element, and additionally connecting a capacitative element corresponding to the difference in accordance with a manufacture variation to obtain a desired capacitance value, thereby minimizing increase in the occupied area. In the case of connecting a capacitative element, however, parasitic capacitance of a wire and a switch for the connection cannot be ignored. Consequently, in the method of additionally connecting a capacitative element corresponding to the difference, when the number of capacitative elements to be connected is determined in consideration of only the area ratio of the capacitative elements, high-precision adjustment cannot be performed. On the other hand, when the area of the capacitative elements corresponding to the difference is preliminarily determined in consideration of the parasitic capacitance of a wire and a switch for connection, the parasitic capacitance has to be estimated. Consequently, designing becomes very troublesome and the capacitative element itself also has a manufacture variation. There is a problem such that high-precision adjustment cannot be made as a result.

An object of the present invention is to provide a circuit technique capable of adjusting the characteristics of a PLL circuit including an oscillator, a phase comparator, a charge pump circuit, and a loop filter in accordance with manufacture variations in a resistive element and a capacitative element without providing a plurality of capacitative elements, that is, without increasing an occupied area so much and, capable of forming a loop filter on a chip.

Another object of the invention is to provide a semiconductor integrated circuit with a PLL circuit in which, even when a loop filter is constructed by elements on a chip, variations in characteristics due to variations in the elements can be corrected, and the yield does not deteriorate.

Further another object of the invention is to provide a semiconductor integrated circuit with a PLL circuit, in which the characteristics of a built-in loop filter can be adjusted without increasing a manufacturing step and, even when the loop filter is formed on a chip, the manufacture cost is not so increased.

The above and other objects of the invention and novel features will become apparent from the description of the specification and the appended drawings.

An outline of representative ones of inventions disclosed in the application will be described as follows.

The invention provides a semiconductor integrated circuit with a PLL circuit, including an oscillator, a phase comparator, a charge pump circuit, and a loop filter, for controlling the oscillator with a voltage obtained by smoothing an output of the charge pump circuit by the loop filter. A resistive element and a capacitative element as components of the loop filter are formed on a semiconductor chip. The resistive element is constructed by a plurality of elements having different resistance values which are switched by a switch, thereby enabling the resistance value to be adjusted. An output current of the charge pump circuit is also made adjustable according to the switch among the resistance values of the resistive elements.

Preferably, the following circuits are provided on the same semiconductor chip as that of the PLL circuit. The circuits are a current circuit (hereinbelow, called a current monitor circuit) including a resistive element and a capacitative element which match well with the resistive element and the capacitative element of the loop filter and having a configuration similar to that of the charge pump of the PLL circuit, a current-voltage converter for converting a monitor current generated by the current monitor circuit into a voltage, and a correcting circuit for measuring time elapsed before the converted voltage reaches a predetermined level, estimating the product of a resistance value and a capacitance value of the loop filter on the basis of the measured time, and adjusting the resistance value of the resistive element of the loop filter and the current in the charge pump circuit in accordance with the estimated product.

With the means, in the case where the capacitance value of the capacitative element as a component of the loop filter varies, by adjusting the current in the charge pump circuit and the resistive element in the filter, the characteristic (open loop gain characteristic) of the PLL circuit can be changed close to a desired characteristic. Thus, the characteristic can be corrected without providing a plurality of capacitative elements for adjustment. Since the desired characteristic can be obtained by correction even when the resistive element and the capacitative element as components of the loop filter are formed on a chip, the yield of the semiconductor integrated circuit with the PLL circuit does not deteriorate.

Further, in the case where the resistance value of the resistive element as a component of the loop filter varies, the resistance value is switched by a switch in accordance with the variation, thereby adjusting the resistance value to make the characteristic close to the desired filter characteristic. Moreover, the resistance value is switched by using a control signal of adjusting the current of the charge pump circuit, so that the scale of the correcting circuit for generating a control signal for adjustment can be decreased, and increase in the chip size can be suppressed. By providing the correcting circuit on the same semiconductor chip as that of the PLL circuit, it becomes unnecessary to measure the resistance value of the resistive element and the capacitance value of the capacitative element in the loop filter by a probe test or the like and correct variations by trimming using a fuse and the like. Consequently, increase in the cost can be avoided.

According to the invention, also in the case where the resistive element and/or the capacitative element as components of the filter varies, by adjusting both of the resistive element in the filter and the resistive element which determines the current in the charge pump circuit, the characteristic of the PLL circuit can be corrected so as to be close to the desired characteristic.

Effects obtained by the representative one of the inventions disclosed in the application will be briefly described as follows.

In a PLL circuit including an oscillator, a phase comparator, a charge pump circuit, and a loop filter, without providing a plurality of capacitative elements, that is, without increasing an occupied area so much, the characteristic of the PLL circuit can be adjusted in accordance with manufacture variations in the resistive element and the capacitative element so that a loop filter can be formed on a chip.

Even when a loop filter is constructed by elements on a chip, variations in characteristics due to variations in the elements can be corrected, and the yield does not deteriorate. In addition, without increasing a manufacturing step, the characteristics of a built-in loop filter can be adjusted. Consequently, even when the loop filter is formed on a chip, a semiconductor integrated circuit with the PLL circuit whose manufacture cost is not so increased can be realized.

DETAILED DESCRIPTION OF THE PREFERRED EMBODIMENTS

Preferred embodiments of the present invention will be described hereinbelow with reference to the drawings.

Figure 1:
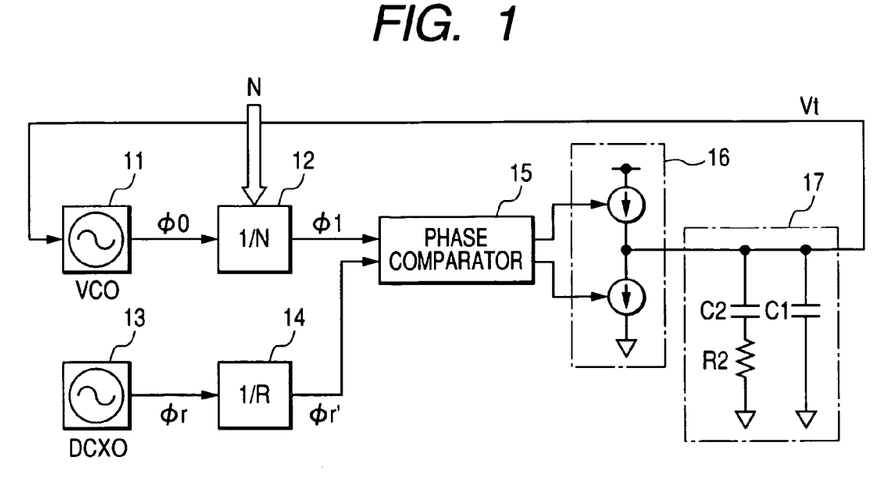
FIG. 1 is a block diagram showing an example of the configuration of a PLL circuit to which the invention is suitably applied.

FIG. 1 shows a configuration example of a PLL circuit to which the invention is preferably applied.

A PLL circuit of the embodiment has a voltage-controlled oscillator (VCO) 11, a variable frequency divider 12 for frequency-dividing an oscillation signal φ0 of the VCO 11 to 1/N on the basis of a frequency division ratio N which is set from the outside, a fixed frequency divider 14 for frequency-dividing an oscillation signal φr from a reference oscillator (DCXO) 13 for generating a reference oscillation signal φr such as 26 MHz, a phase comparator 15 for detecting the phase difference between signals φ1 and φr' subjected to frequency division in the variable frequency divider 12 and the fixed frequency divider 14, respectively, a charge pump 16 for generating a charge current or discharge current according to the detected phase difference, and a loop filter 17 for smoothing an output of the charge pump 16. The voltage smoothed by the loop filter 17 is fed back as a control voltage Vt to the VCO 11 to control the oscillation frequency of the VCO 11.

As the loop filter 17, although not limited, in the embodiment, a second-order lag-lead filter having a capacitative element C1 connected in series between an output terminal of the charge pump 16 and the earth point, and a capacitative element C2 and a resistive element R2 connected in series and provided in parallel with the capacitative element C1 is used. The charge pump 16 has a current source CS1 for charge-up and a current source CS2 for charge-down. When the phase of the signal φ1 obtained by frequency division of the variable frequency divider 12 lags behind the phase of the reference signal φr', current of the current source CS1 for charge-up is increased so that the smoothed voltage Vt of the loop filter 17 becomes high and the oscillation frequency of the VCO 11 becomes high. On the other hand, when the phase of the signal φ1 obtained by frequency division of the variable frequency divider 12 leads the phase of the reference signal φr', current of the current source CS2 for charge-down is increased so that the smoothed voltage Vt of the loop filter 17 becomes low and the oscillation frequency of the VCO 11 becomes low.

Figure 2:
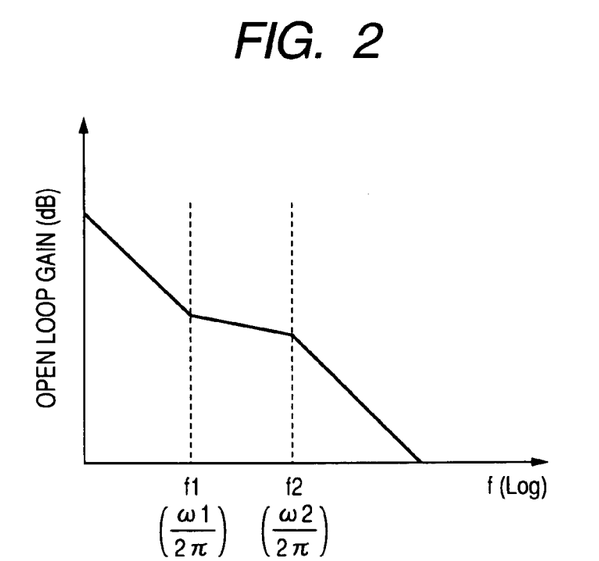
FIG. 2 is a characteristic diagram showing a frequency characteristic of a loop filter in FIG. 1.

FIG. 2 shows a frequency characteristic of an open loop of the PLL circuit in FIG. 1 when the horizontal axis indicates frequency in logarithm scale. The graph has the zero point at frequency f1, and has the pole at frequency f2. To make the characteristics of the loop filter constant, the open loop gain characteristic has to be made constant. When the current of the charge pump 16 is Ipd, the gain of the VCO 11 is Kv, and the frequency division ratio of the variable frequency divider 12 is N, transfer function G0(s) of the open loop gain is expressed by the following equation.

$$G0(s) = \frac{Ipd \cdot kv}{(C1+C2) \cdot N} \cdot \frac{1+\frac{s}{\omega 1}}{s^2 \cdot \left(1+\frac{s}{\omega 2}\right)} \quad (1)$$

Since the gain Kv of the VCO 11 and the frequency division ratio N of the variable frequency divider 12 can be regarded as constant, it is understood that by making Ipd/(C1+C2), $\omega 1$, and $\omega 2$ constant, the transfer function G0(s) can be made constant. $\omega 1$ and $\omega 2$ are values corresponding to the frequencies f1 and f2 of the zero point and the pole, respectively, in the open loop gain characteristic of FIG. 2, and are expressed as f1=$\omega 1/2\pi$ and f2=$\omega 2/2\pi$, respectively.

The zero point f1 and the pole f2 are expressed by the following equations.

$$f1 = 1/\{2\pi \cdot C2 \cdot R2\} \quad (2)$$

$$f2 = (C1+C2)/(2\pi \cdot C1 \cdot C2 \cdot R2) \quad (3)$$

When it is assumed that C2 is sufficiently larger than C1, Equation (2) can be modified as the following equation.

$$f2 \approx 1/2\pi \cdot C1 \cdot R2 \quad (4)$$

It is understood that, by making the products C2·R2 and C1·R2 of resistance and capacitance constant by Equations (2) and (4), the positions of the zero point f1 and the pole f2 can be maintained almost constant.

Figure 3:
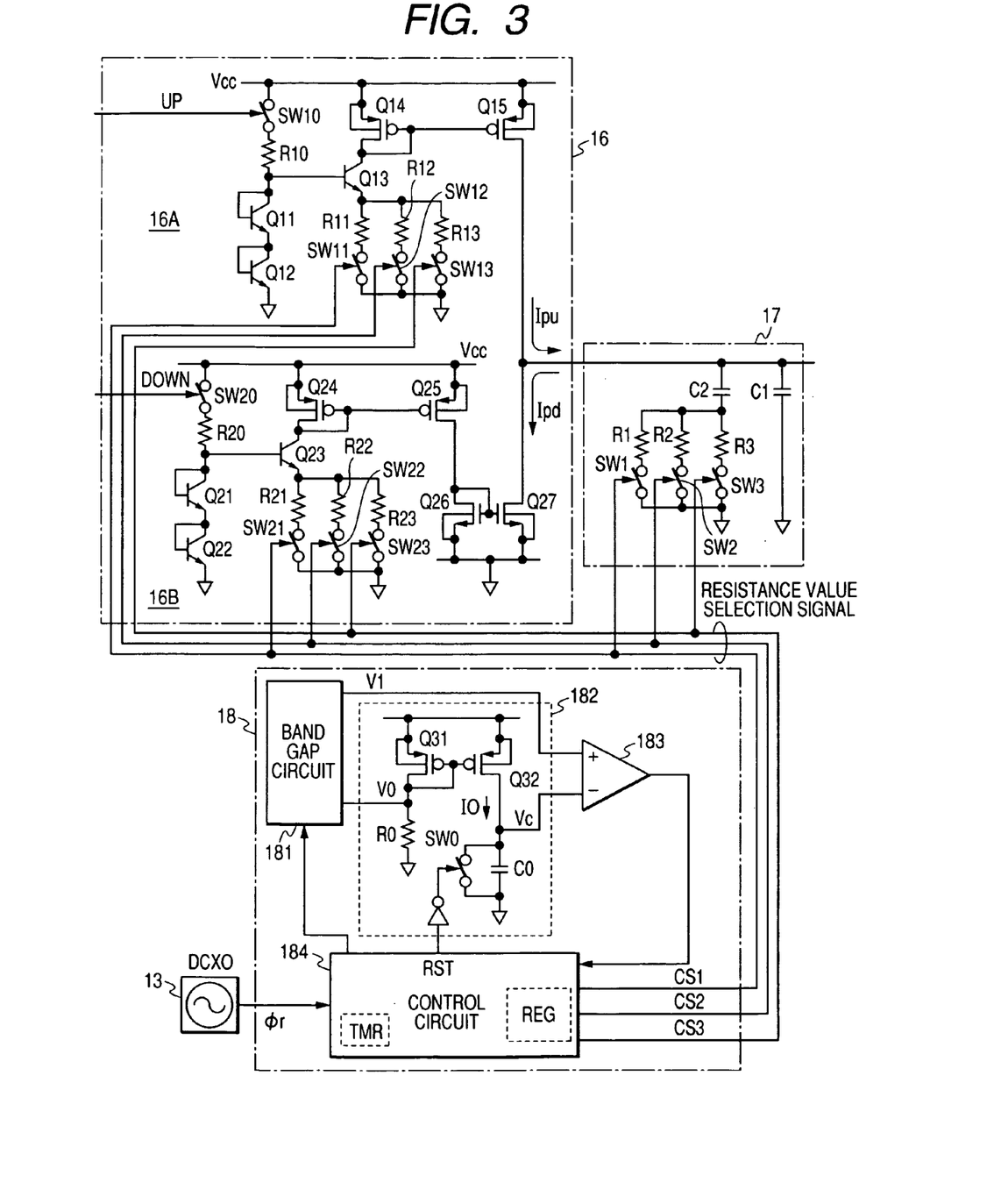
FIG. 3 is a circuit diagram showing a concrete example of a characteristic correcting circuit for correcting characteristics of a charge pump and a loop filter in the PLL circuit of the embodiment.

FIG. 3 shows a concrete circuit example of a characteristic correcting circuit 18 for correcting characteristics of the charge pump 16 and the loop filter 17 in the PLL circuit of the embodiment developed from the above-described viewpoint.

The loop filter 17 of the embodiment has a configuration such that the resistive element R2 of the loop filter constructed by the capacitive elements C1 and C2 and the resistive element R2 shown in FIG. 1 is replaced with three resistive elements R1, R2, and R3 having different resistance values and formed in parallel and switch elements SW1, SW2, and SW3 connected to the resistive elements R1, R2, and R3 in series, respectively. One of the switch elements SW1, SW2, and SW3 is selectively turned on by control signals CS1, CS2, and CS3 from the characteristic correcting circuit 18, thereby enabling the characteristic of the filter to be corrected. For example, when the resistance value of the resistive element R2 is 1, the resistance value of the resistive element R1 is 0.9 time, and that of the resistive element R3 is 1.1 times.

The charge pump 16 has a current circuit 16A for passing charge-up current Ipu to the loop filter 17 in accordance with a signal UP indicative of phase lag from the phase comparator 15, and a current circuit 16B for passing charge-down current Ipd for charging down the loop filter 17 in accordance with a signal DOWN indicative of phase lead from the phase comparator 15.

The current circuit 16A is constructed by a switch SW10 which is turned on/off according to the signal UP indicative of phase lag from the phase comparator 15, a resistor R10 and bipolar transistors Q11 and Q12 which are connected in series with the switch SW10, a bipolar transistor Q13 whose base terminal is connected to a connection node between the resistor R10 and the transistor Q11, three resistive elements R11, R12, and R13 connected in parallel between the collector of the bipolar transistor Q13 and the earth point, switch elements SW11, SW12, and SW13 connected in series with the resistive elements R11, R12, and R13, respectively, a MOS transistor Q14 connected between the emitter of the transistor Q13 and a power source voltage terminal Vcc, and a MOS transistor Q15 whose gate is commonly connected with the gate of the MOS transistor Q14.

The transistors Q11 and Q12 each having a base and a collector coupled to each other act as a diode and apply, as a bias voltage, a potential twice as large as a base-emitter voltage VBE when the switch SW10 is in an ON state to the base of the transistor Q13, thereby passing collector current to the transistor Q13. The gate and drain of the MOS transistor Q14 are coupled to each other, and the MOS transistor Q14 functions as a current-voltage converting device. The gates of the transistors Q14 and Q15 are commonly connected, so that the transistors Q14 and Q15 construct a current mirror circuit. A current proportional to a current flowing in the transistor Q14 is passed to the transistor Q15 and is output as the charge-up current Ipu. In the embodiment, the transistors Q14 and Q15 are formed so as to have the same size, so that current whose magnitude is the same as that of the current flowing in the transistor Q14 is passed to the transistor Q15.

One of the switch elements SW11, SW12, and SW13 is selectively turned on by the control signals CS1, CS2, and CS3 from the characteristic correcting circuit 18, thereby enabling the collector current of the transistor Q13 and the charge-up current Ipu to be changed. For example, when the resistance value of the resistive element R12 is 1, the resistance value of the resistive element R11 is 0.9 time, and that of the resistive element R13 is 1.1 times.

The current circuit 16B has a configuration similar to that of the current circuit 16A. The different point is that, since the current circuit 16B is a current circuit for discharging, a diode-connected MOS transistor Q26 connected in series with a MOS transistor Q25 corresponding to the MOS transistor Q15 in the current circuit 16A, and a MOS transistor Q27 whose gate is commonly connected with the gate of the MOS transistor Q26 to construct a current mirror circuit are provided, and by sending back the current of the MOS transistor Q26 by the current mirror Q26, the discharge current Ipd is generated.

The characteristic correcting circuit 18 is constructed by: a constant voltage circuit 181 such as a band gap reference circuit for generating constant voltages V0 and V1 having no power source voltage dependency and no temperature dependency; a current monitor circuit 182 having MOS transistors Q31 and Q32 having gate terminals to which the constant voltage V0 generated by the constant voltage circuit 181 is applied and which are commonly connected to construct a current mirror circuit; a comparator 183 for comparing a voltage obtained by smoothing a monitor current of the current monitor circuit 182 by capacitance C0 with the constant voltage V1 generated by the constant voltage circuit 181; and a control circuit 184 having a timer TMR for measuring time that elapses before an output of the comparator 183 is inverted, and outputting the control signals CS1 to CS3 for turning on/off the switch elements SW11 to SW13 and SW21 to SW23 in the charge pump 16 and the switch elements SW1 to SW3 in the loop filter 17 in accordance with the measured time. The timer TMR can be constructed by a counter for counting oscillation signals φr from the reference oscillator (DCXO) 13.

The current monitor circuit 182 has a resistor R0 connected in series with the MOS transistor Q31 for the current mirror, generates a monitor current I0 in which variations in the resistor R0 are reflected, and has a capacitative element C0 charged with the monitor current I0, and a switch element SW0 for resetting the capacitative element C0 by discharging. When charging of the capacitative element C0 is reset and the reset is cancelled, the capacitative element C0 is charged with the current I0 and its voltage V0 gradually increases. When the voltage V0 reaches the constant voltage V1, an output of the comparator 183 is inverted. Therefore, time Tc required for an output of the comparator 183 to be inverted after the cancel of the reset is proportional to the capacitance value of the capacitative element C0 and is inversely proportional to the current value of the monitor current I0, that is, T∝C0/I0.

The monitor current I0 is current in which variations of the resistive element R0 are reflected as described above and the resistive element R0 is constructed by a resistive element which matches well with the resistive elements R11 to R13 and R21 to R23 in the charge pump 16. With the configuration, the monitor current I0 can be formed as current having variations similar to those of the output currents Ipu and Ipd of the charge pump 16 irrespective of manufacturing variations in the resistive elements. In the embodiment, a capacitative element which matches well with the capacitative elements C1 and C2 as components of the loop filter 17 is used as the capacitative element C0 in the current monitor circuit 182, and a resistive element which matches well with the resistive element R2 as a component of the loop filter 17 is used as the resistive elements R11 to R13 and R21 to R23 in the charge pump 16.

Required time Tc for the voltage V0 reaches V1 is measured by the timer in the control circuit 184. When Tc is larger than a target value T0, the output currents Ipu and Ipd of the charge pump 16 are increased. When Tc is smaller than the target value T0, the output currents Ipu and Ipd of the charge pump 16 are decreased. In such a manner, Ipd/(C1+C2) expressed by Equation (1) can be made constant. To increase the output currents Ipu and Ipd of the charge pump 16, it is sufficient to select small one of resistance values of the resistive elements R11 to R13 and R21 to R23. To decrease the output currents Ipu and Ipd of the charge pump 16, it is sufficient to select large one of resistance values of the resistive elements R11 to R13 and R21 to R23.

The control circuit 184 in FIG. 3 is constructed to generate the control signals CS1 to CS3 for performing selecting operation as described above. The control circuit 184 generates a reset signal RST for turning on the switch element SW0 to reset charging of the capacitative element C0, and has a register REG for holding the states of the control signals CS1 to CS3 determined on the basis of the required time Tc that elapses before the output of the comparator 183 is inverted.

Further, in the embodiment, the resistive elements R1 to R3 in the loop filter 17 are also selected by the control signals CS1 to CS3 which select the resistive elements R11 to R13 and R21 to R23 in the charge pump 16. Consequently, not only variations in the current in the charge pump but also variations in the characteristics of the loop filter can be corrected, and ω1 and ω2 in Equation (1) can be made constant. As a result, by correcting the output currents Ipu and Ipd in the charge pump 16, not only Ipd/(C1+C2) but also the transfer function G0(s) can be made constant, and the open loop gain characteristic of the PLL circuit can be made constant. In the embodiment, by providing the correcting circuit 18 as a circuit common to the charge pump 16 and the loop filter 17, enlargement of the circuit scale can be suppressed.

The reason why ω1 and ω2 in Equation (1) can be made constant in the embodiment will now be described. As described above, the current monitor circuit 182 is provided to detect the required time Tc which elapses before the capacitative element C0 is charged with the monitor current I0 and the voltage Vc reaches the predetermined voltage V1, and Tc is proportional to the capacitance value of the capacitative element C0 and is inversely proportional to the current value of the monitor current I0, so that Tc∝C0/I0 is satisfied. Since the current value of the monitor current I0 is inversely proportional to the resistance value of the resistive element R0, Tc∝R0·C0 is satisfied, and Tc is proportional to the product between resistance and capacitance. Therefore, when the required time Tc is measured and the resistance value of the loop filter is changed so that the required time Tc becomes constant, even if the resistance and capacitance varies, the product between resistance and capacitance is maintained constant. As described by using Equations (2) and (4), the positions of the zero point f1 and the pole f2 can be made almost constant. As a result, the open loop gain characteristic of the PLL circuit can be made constant.

Figure 4:
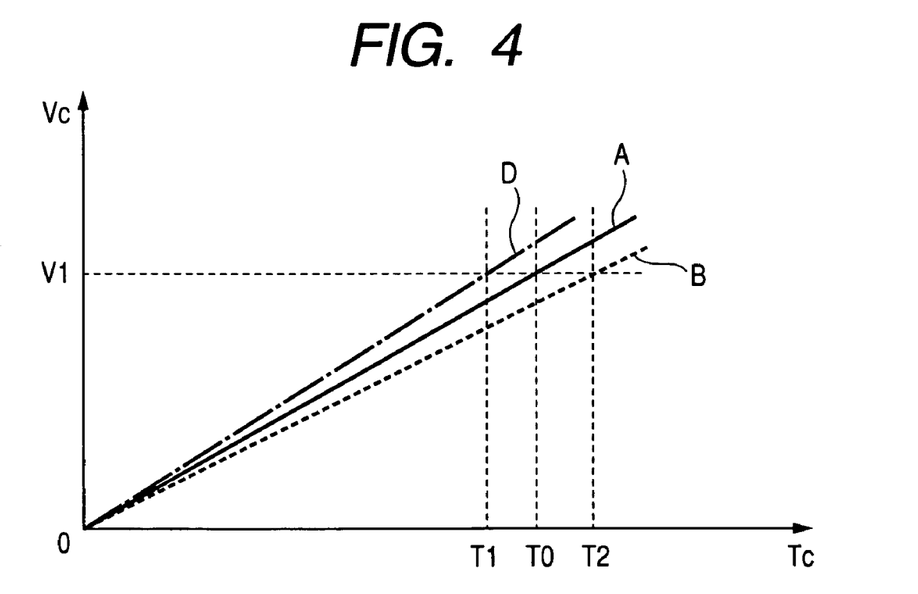
FIG. 4 is a graph showing a state of variations in required time Tc caused by variations in resistive elements and capacitative elements.

FIG. 4 shows a state of variations in the required time Tc due to variations in the resistive and capacitative elements, and Table 1 shows the relations among the control signals CS1 to CS3 generated in correspondence with the variations in the required time Tc and the resistive elements selected by the control signals CS1 to CS3.

In FIG. 4, the solid line A shows the case where there is no variation. The broken line B shows the case where resistance and/or capacitance varies to the increase side and the required time Tc becomes long. The long and short dash line D indicates the case where resistance and/or capacitance varies to the decrease side and the required time Tc becomes short. The required time Tc becomes long when resistance varies to the increase side, and becomes short when resistance varies to the decrease side for the reason that the monitor current I0 decreases when the resistance R0 increases in the monitor circuit 182 in FIG. 3, and increases when the resistance R0 decreases.

TABLE 1

| measurement result of Tc | Product of capacitance and resistance | CS1 | CS2 | CS3 | Filter selected resistance | Charge pump selected resistance |
|---|---|---|---|---|---|---|
| T0 | ±0% | L | H | L | R2 | R12, R22 |
| T1(0.9 × T0) | −10% | L | L | H | R3(1.1R2) | R13, R23 (1.1 times) |
| T2(1.1 × T0) | +10% | H | L | L | R1(0.9R2) | R11, R21 (0.9 time) |

As understood from Table 1, when the required time Tc becomes shorter, the switches SW3, SW13, and SW23 are turned on to select the resistive elements R3, R13, and R23 having large resistance values. When the required time Tc becomes longer, the switches SW1, SW11, and SW21 are turned on to select the resistive elements R1, R11, and R21 having small resistance values.

In the description of FIG. 3, as the resistive element R0 in the monitor circuit 182 and the resistive elements R11 to R13 and R21 to R23 in the charge pump 16, resistive elements which matches well with the resistive element R2 as a component of the loop filter 17 are used. As the capacitative element C0 in the monitor circuit 182, a capacitative element which matches well with the capacitative elements C1 and C2 as components of the loop filter 17 is used. In other words, elements are formed of the same material in the same direction in the same step. Consequently, when an element as a component of the loop filter 17 varies, an element as a component of the monitor circuit 182 and an element as a component of the charge pump 16 similarly vary. Thus, accurate characteristic correction can be made. From the viewpoint of setting the degrees of variations to be the same as much as possible, it is desirable to form elements so as to be close to each other on a semiconductor chip.

In the embodiment, as each of the resistive element in the charge pump 16 and the resistive element in the loop filter 17, three resistive elements having different resistance values are provided and any one of them is selected. The number of resistive elements is not limited to three but may be four or more. The larger the number of resistive elements prepared is, the characteristic can be corrected with higher precision. In the embodiment of FIG. 3, the correcting circuit 18 is provided as a circuit common to the charge pump 16 and the loop filter 17. Alternately, correcting circuits can be separately provided for the charge pump 16 and the loop filter 17. Variation in current in the charge pump and variation in resistance of the loop filter can be corrected separately, so that optimum correction can be made.

In the correcting circuit 18 of the foregoing embodiment, the constant voltage V0 from the constant voltage circuit 181 is applied to the gate terminals of the MOS transistors Q31 and Q32. It is also possible to provide a bipolar transistor corresponding to the transistor Q13 in the charge pump of FIG. 3 between the MOS transistor Q31 and the resistor R0 in the correcting circuit 18, apply the constant voltage V0 from the constant voltage circuit 181 to the base terminal of the bipolar transistor, and pass current proportional to the resistance value of the resistor R0.

Although it is described in the foregoing embodiment that the charge pump 16 is constructed as a circuit separate from the phase comparator 15, depending on a circuit form employed, there is a case such that the output stage of the phase comparator 15 has the function of passing/receiving current according to the phase difference. It can be also regarded that the charge pumps 16A and 16B in FIG. 3 construct the output stage of the phase comparator 15. Therefore, inventions have to be substantially compared with each other without sticking to the names of circuits.

Figure 5:
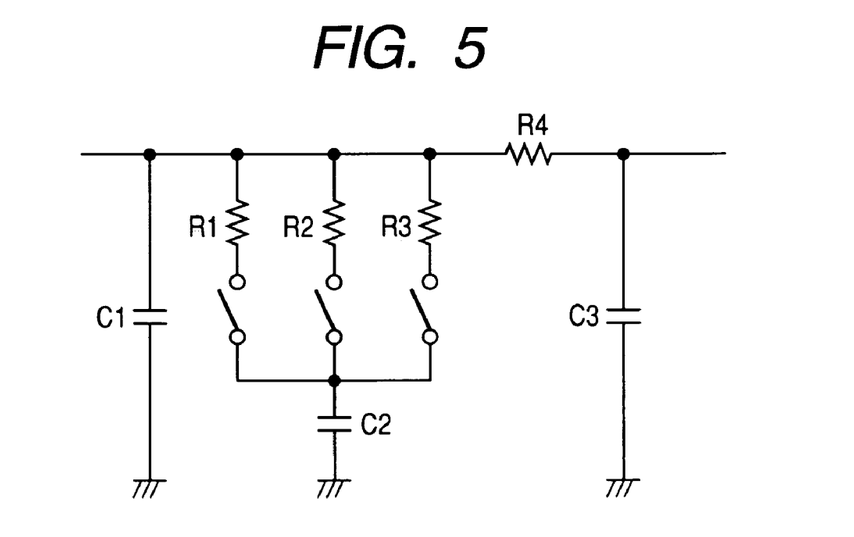
FIG. 5 is a circuit diagram showing a configuration example of a third-order loop filter.

Although the case of applying the invention to the PLL circuit using the second-order loop filter has been described in the foregoing embodiment, the invention can be also applied to a PLL circuit using a third-order loop filter. FIG. 5 shows a configuration example of a third-order loop filter. The third-order loop filter has a configuration obtained by adding a resistor R4 and a capacitor C3 to the second-order loop filter shown in FIG. 3.

In the third-order loop filter of FIG. 5, like the second-order loop filter shown in FIG. 3, the resistor connected in series with the capacitor C2 is constructed by the plurality of resistors R1 to R3 having resistance values different from each other. A plurality of resistors are not provided as the resistor R4 since the resistor R4 gives the frequency pole much higher than f2 in FIG. 2 and hardly exerts an influence to f1 and f2. In the case of adjusting the open loop gain characteristic with higher precision, preferably, the resistor R4 is replaced with a plurality of resistors connected in parallel like the resistors R1 to R3, and the plurality of resistors are switched.

Next, an embodiment of applying the PLL circuit according to the invention to an RF-IC having the function of modulating/demodulating transmission/reception signals and a configuration example of a radio communication system will be described by using FIGS. 6 and 7. A transmission system in each of FIGS. 6 and 7 is constructed by an offset PLL system.

Figure 6:
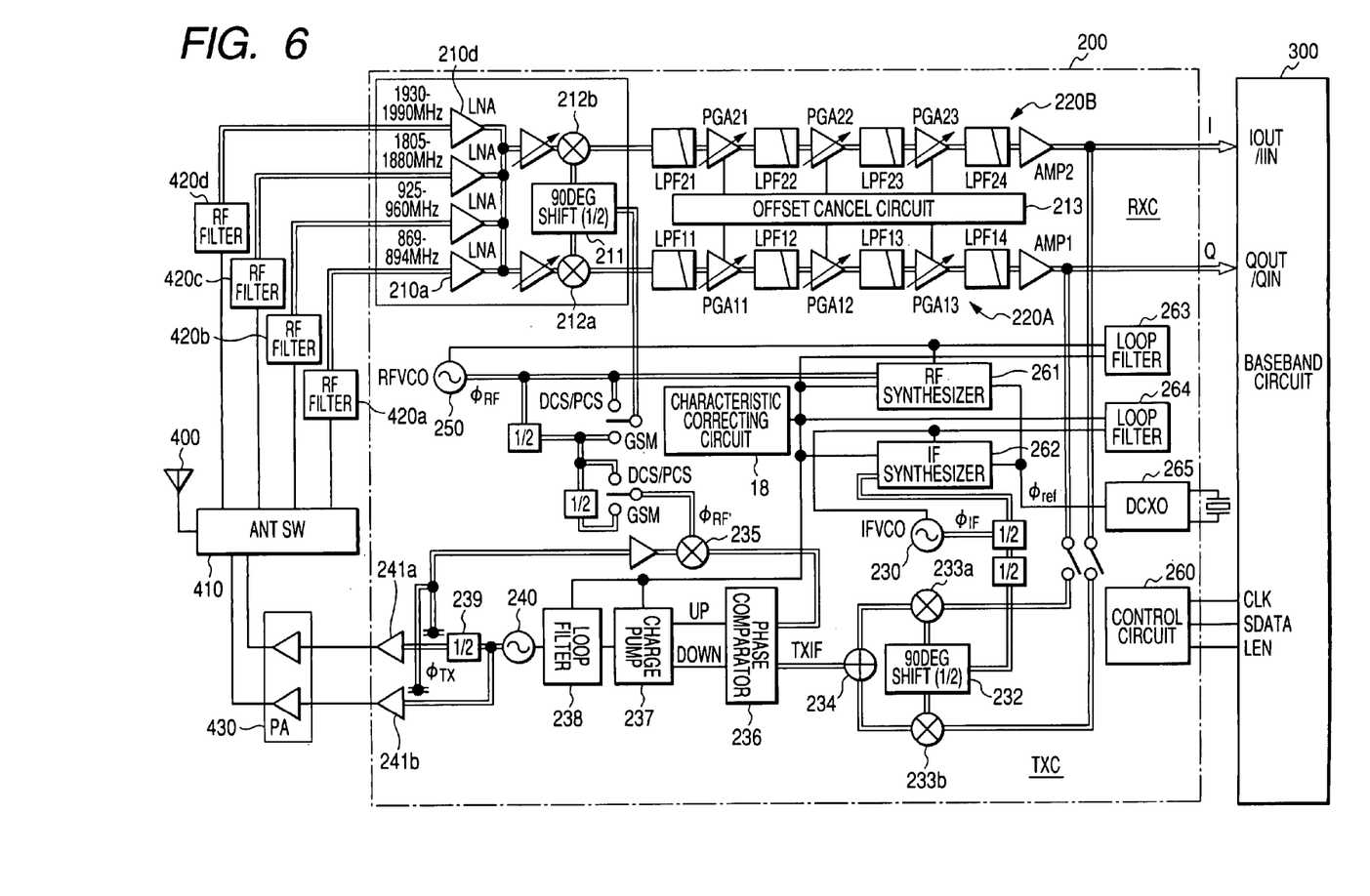
FIG. 6 is a block diagram showing an embodiment of applying a PLL circuit of the invention to an RF IC having the function of modulating/demodulating a transmission/reception signal and a configuration example of a radio communication system.
Figure 7:
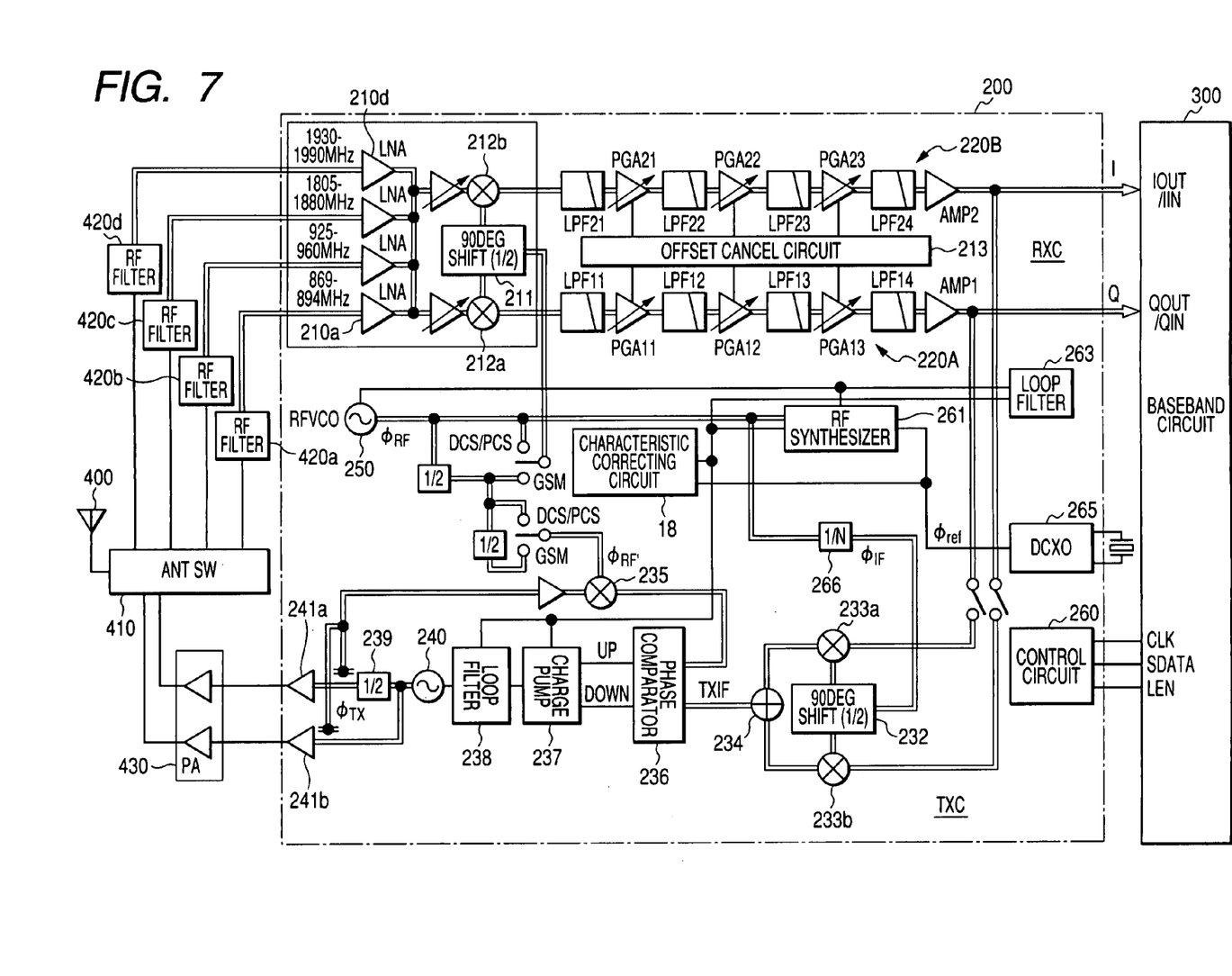
FIG. 7 is a block diagram showing another embodiment of applying the PLL circuit of the invention to an RF IC having the function of modulating/demodulating a transmission/reception signal and a configuration example of a radio communication system.

As shown in FIG. 6, the radio communication system of the embodiment includes an antenna 400 for transmitting/receiving signal electric waves, a switch 410 for switching transmission/reception, band-pass filters 420a to 420d taking the form of, for example, SAW filters that eliminates unnecessary waves from a reception signal, a high-frequency power amplifier (power module) 430 for amplifying a transmission signal, a radio-frequency IC 200 for demodulating a reception signal and modulating a transmission signal, and a baseband circuit 300 for converting transmission data to I and Q signals and controlling the RF IC 200. In the embodiment, the RF IC 200 and the baseband circuit 300 are constructed as semiconductor integrated circuits on different semiconductor chips.

Although not limited, the RF IC 200 can modulate/demodulate signals in four frequency bands by communication methods of GSM850, GSM900, DCS1800, and PCS1900. Accordingly, as the band pass filters, the filter 420a passing a reception signal in the frequency band of GSM850, the filter 420b passing a reception signal in the frequency band of GSM900, the filter 420c passing a reception signal in the frequency band of DCS1800, and the filter 420d passing a reception signal in the frequency band of PCS1900 are provided.

The RF IC 200 of the embodiment is constructed roughly by a reception circuit RXC, a transmission circuit TXC, and a control system including circuits common to the transmission and reception systems, such as other control circuits and clock generating circuits.

The reception circuit RXC includes: low-noise amplifiers 210a to 210d for amplifying reception signals in the frequency bands of GSM850, GSM900, DCS1800, and PCS1900; a frequency-division phase-shift circuit 211 for frequency-dividing a local oscillation signal φRF generated by a radio frequency oscillator (RFVCO) 250 to generate orthogonal signals whose phases are shifted from each other by 90°; mixers 212a and 212b for mixing the orthogonal signals generated by the frequency-division phase-shift circuit 211 with the reception signals amplified by the low noise amplifiers 210a to 210d, thereby demodulating and down-converting I and Q signals; high gain amplifiers 220A and 220B common to the frequency bands, which amplify the demodulated I and Q signals and output the resultant signals to the baseband circuit 300; and an offset cancel circuit 213 for canceling an input DC offset of amplifiers in the high gain amplifiers 220A and 220B.

The high gain amplifier 220A has a configuration in which a plurality of low pass filters LPF11, LPF12, LPF13, and LPF14 and gain control amplifiers PGA11, PGA12, and PGA13 are alternately connected in series, and an amplifier AMP1 is connected in the final stage. The high gain amplifier 220A amplifies the demodulated I signal to a predetermined amplification level while removing unnecessary waves. The high gain amplifier 220B similarly has a configuration in which a plurality of low pass filters LPF21, LPF22, LPF23, and LPF24 and gain control amplifiers PGA21, PGA22, and PGA23 are alternately connected in series, and an amplifier AMP2 is connected in the final stage. The high gain amplifier 220B amplifies the demodulated Q signal to a predetermined amplification level.

The offset cancel circuit 213 includes: A/D converters (ADC) provided in correspondence with the gain control amplifiers PGA11 to PGA23 and converting an output potential difference in a state where input terminals are short-circuited into a digital signal; D/A converters (DAC) each generating an input offset voltage which sets a DC offset of an output of corresponding one of the gain control amplifiers PGA11 to PGA23 to zero and applying the input offset voltage for a differential input; and a control circuit for controlling the A/D converters (ADC) and the D/A converters (DAC) to perform an offset canceling operation.

The transmission circuit TXC includes: an oscillator (IFVCO) 230 for generating an oscillation signal $\phi$IF of an intermediate frequency such as 640 MHz; a frequency-division phase-shift circuit 232 for frequency-dividing the oscillation signal $\phi$IF generated by the oscillator 230 to generate orthogonal signals whose phases are shifted from each other by 90°; orthogonal modulation circuits 233a and 233b which are mixers for modulating the generated orthogonal signals by the I and Q signals supplied from the baseband circuit 300; an adder 234 for adding modulated signals; an oscillator (TXVCO) 240 for transmission for generating a transmission signal $\phi$TX of a predetermined frequency; an offset mixer 235 for mixing a feedback signal obtained by extracting the transmission signal $\phi$TX output from the oscillator 240 for transmission by a coupler or the like and a signal $\phi$RF' obtained by frequency-dividing the oscillation signal $\phi$RF generated by the radio-frequency oscillator (RFVCO) 250, thereby generating a signal of the frequency corresponding to the frequency difference of the signals; a phase comparator 236 for comparing an output of the offset mixer 235 with a signal TXIF obtained by the adder 234 to detect the frequency difference and the phase difference; a charge pump 237 for generating a voltage according to an output of the phase comparator 236; a loop filter 238 for smoothing an output of the charge pump 237; a frequency divider 239 for frequency-dividing an output of the TXVCO 240 to generate a GSM transmission signal; and buffer circuits 241a and 241b for converting a differential output to a single signal and outputting the single signal.

One of the buffer circuits 241a and 241b is a circuit for outputting a signal in the band of 850 to 900 MHz for GSM, and the other one is a circuit for outputting a signal in the band of 1800 to 1900 MHz for DCS and PCS.

On the chip of the RF IC 200 of the embodiment, a control circuit 260 for controlling the whole chip, an RF synthesizer 261 and a loop filter 263 constructing a PLL circuit for RF in cooperation with the RF oscillator (RFVCO) 250, an IF synthesizer 262 and a loop filter 264 constructing a PLL circuit for IF in cooperation with the intermediate-frequency oscillator (IFVCO) 230, and a reference oscillator (DCXO) 265 for generating a clock signal $\phi$ref as a reference signal of the synthesizers 261 and 262 are provided.

Although not shown, the synthesizers 261 and 262 have therein the fixed frequency dividers 14 shown in FIG. 1 for frequency-dividing an oscillation signal of the reference oscillator 265. The frequency-divided clocks are used in the synthesizers 261 and 262. Each of the synthesizers 261 and 262 includes a variable frequency divider for dividing oscillation signals of the VCOs 250 and 230, a phase comparator, and a charge pump. Although not limited, in the embodiment, as the phase comparator 236 in the PLL circuit for transmission, an analog phase comparator of high precision is used. As the phase comparator in the RF synthesizer 261, a digital phase comparator having high operation speed is used. Alternately, the phase comparator 236 may be constructed by an analog phase comparator and a digital phase comparator. In the beginning of operation, the digital phase comparator of high speed is operated. After phases almost match each other, the digital phase comparator is switched to the analog phase comparator of high precision. In such a manner, pull-in operation in the beginning of operation of the PLL circuit can be performed at high speed and high precision can be also obtained.

Since the reference oscillation signal $\phi$ref is requested to have high frequency precision, an external quartz resonator is connected to the reference oscillator 265. As the reference oscillation signal $\phi$ref, frequency such as 26 MHz or 13 MHz is selected. A quartz resonator of such a frequency is a general part and is available. In the embodiment of FIG. 6, the reference oscillation signal $\phi$ref of 26 MHz is frequency-divided into $\frac{1}{65}$ by the fixed frequency divider, and the resultant is used as a clock of 400 kHz by the synthesizer 261. Similarly, the reference oscillation signal $\phi$ref is frequency-divided to $\frac{1}{26}$ by the fixed frequency divider, and the resultant is used as a clock of 1 MHz by the synthesizer 262. In short, in the synthesizer 261, the clock of 400 kHz obtained by frequency-dividing the reference signal to $\frac{1}{65}$ is used. In the synthesizer 262, the clock of 1 MHz obtained by frequency-dividing the reference signal to $\frac{1}{26}$ is used.

In the embodiment, the PLL circuit for transmission for performing frequency conversion is constructed by the phase detector 236, charge pump 237, loop filter 238, oscillator (TXVCO) 240 for transmission, and offset mixer 235. Although not shown in FIG. 6, a plurality of resistive elements (R1 to R3) having different resistance values as resistive elements of the loop filters 263, 264, and 238 and switch elements (SW1 to SW3) for selection are provided. As the charge pumps in the synthesizers 261 and 262 and the charge pump 237 of the transmission system, as shown in FIG. 3, charge pumps having the plurality of resistive elements R11 to R13 and R21 to R23) for switching an output current value and switch elements (SW11 to SW13 and SW21 to SW23) for selection are used.

The characteristic correcting circuit 18 of the embodiment is provided as a circuit common to three PLL circuits; the PLL circuit for transmission, the PLL circuit for RF, and the PLL circuit for IF. At power-on, in the characteristic correcting circuit 18, time required for the voltage V0 to reach V1 is measured and, on the basis of the measurement, any of the resistor-selecting control signals CS1 to CS3 is determined.

The control circuit 260 in the RF IC of the embodiment has a control register in which a setting is made on the basis of a signal from the baseband IC 300. Concretely, a clock signal CLK for synchronization, a data signal SDATA, and a load enable signal LEN as a control signal are supplied from the baseband IC 300 to the RF IC 200. When the load enable signal LEN is asserted to a valid level, the control circuit 260 sequentially latches the data signals SDATA transmitted from the baseband IC 300 synchronously with the clock signal CLK, sets them in the control register and, according to the set data, generates a control signal for each of circuits in the IC. Although not limited, the data signals SDATA are transmitted in series. The baseband IC 300 is constructed by a microprocessor and the like. The data signal SDATA includes a command sent from the baseband IC 300 to the RF IC 200.

In the multi-band radio communication system of the embodiment, for example, by a command from the baseband IC 300, the control circuit 260 changes the frequency φRF of the oscillation signal of the RF oscillator 250 in accordance with a channel used at the time of transmission/reception and changes the frequency of a signal to be supplied to the offset mixer 235 according to the mode which is the GSM mode or the DCS/PCS mode, thereby switching the transmission frequency.

The oscillation frequency of the RF oscillator (RFVCO) 250 is set to a value which varies between the reception mode and the transmission mode. In the transmission mode, the oscillation frequency fRF of the RF IC (RFVCO) 250 is set to 3616 to 3716 MHz in the case of GSM850, 3840 to 3980 MHz in the case of the GSM900, 3610 to 3730 MHz in the case of the DCS and, further, 3860 to 3980 MHz in the case of the PCS. The oscillation frequency fPF is divided into ¼ in the case of GS and ½ in the case of DCS and PCS, and the resultant signal is supplied to the offset mixers 235a and 235b.

The offset mixer 235a outputs a signal corresponding to the frequency difference (fRF-fTX) between the oscillation signal φRF from the RFVCO 250 and the oscillation signal φTX for transmission from the oscillator 240 for transmission. The transmission PLL (TX-PLL) operates so that the frequency of the difference signal coincides with the frequency of the modulation signal TXIF. In other words, the TXVCO 240 is controlled to oscillate at the frequency corresponding to the difference (offset) between the frequency (fRF/4 in the case of GSM or fRF/2 in the case of DCS and PCS) of the oscillation signal φRF from the RFVCO 250 and the frequency of the modulation signal TXIF. That is why the circuit is called an offset PLL.

FIG. 7 shows a configuration example of an RF IC realizing reduction in chip size by omitting the IFVCO by frequency-dividing the oscillation signal φRF of the RFVCO 250 to generate a local signal of the intermediate frequency. The IF PLL circuit including the IFVCO, IF synthesizer, and IF loop filter is not provided. Instead, an IF frequency divider 266 for frequency-dividing an oscillation signal of the RFVCO to generate the signal φIF of the intermediate frequency is provided. The RF PLL circuit takes the form of a fractional PLL in which the variable frequency divider in the RF synthesizer 261 is constructed by a circuit capable of frequency-dividing the oscillation signal φRF of the RFVCO 250 at a frequency division ratio given by an integer and a fraction. The other configuration is similar to that of the system of FIG. 6, so that detailed description will not be given.

In the embodiment, in the case of supplying the reference clock φref of 26 MHz supplied from the DCXO 265 as it is to the RF synthesizer 261, it is desirable to use a third-order loop filter as shown in FIG. 5 as the loop filter of the RF PLL circuit. By using a third-order loop filter, noise in the high frequency domain can be reduced.

Although the invention achieved by the inventors herein has been concretely described above, obviously, the invention is not limited to the foregoing embodiment but can be variously modified without departing from the gist. For example, in the embodiment, as resistors in the loop filter and resistors in the charge pump, resistors whose resistance values are deviated from each other by 10% are prepared. The deviation amount among the resistors as components of the loop filter and that among the resistors as components of the charge pump do not have to be the same. Different deviation amounts may be prepared.

Although the characteristic correcting circuit 18 is provided in the foregoing embodiment, the characteristic correcting circuit 18 may be omitted. In this case, the resistance value of the resistive element and the capacitance value of the capacitative element in the loop filter are measured by a probe test or the like. By performing trimming using fuses and the like or by providing a register or a nonvolatile memory for holding trimming data, variations in resisters as components of the loop filter and the charge pump can be corrected. In the case where means for holding trimming data is a register, trimming data can be supplied from the baseband circuit.

Further, in the foregoing embodiment, an output current of the charge pump is adjusted by switching the resistance values of the resistive elements of the charge pump. Alternately, an output current of the charge pump can be adjusted by providing a plurality of MOS transistors of different sizes in parallel as the MOS transistors Q15 and Q25 constructing the current mirror circuit in the charge pump in FIG. 3 and switching the transistor to which current is passed among the transistors.

Further, in the foregoing embodiment, the case of using the lag-lead filter as the second-order loop filter has been described. The invention can be also applied to the case of using a filter of another form such as a filter in which two first-order filters each constructed by a single capacitative element and a single resistive element are arranged.

The case of applying the invention achieved by the inventors herein to the RF PLL circuit, IF PLL circuit, and transmission PLL circuit built in an RF IC as a component of a radio communication system in the field of use as the background of the invention has been described. However, the invention is not limited to the case but can be generally widely used for a semiconductor integrated circuit with a PLL circuit.

What is claimed is:

1. A semiconductor integrated circuit with a PLL circuit, comprising:
    a voltage-controlled oscillator;
    a phase comparator for comparing a phase of an oscillation signal generated by the voltage-controlled oscillator with a phase of a reference signal and generating a signal according to a phase difference thereof;
    a charge pump circuit operated by the signal generated by the phase comparator; and
    a loop filter for smoothing an output of the charge pump circuit, the voltage smoothed by the loop filter being supplied to said voltage-controlled oscillator to control an oscillation frequency,
    wherein a resistive element and a capacitive element as components of said loop filter are formed over a semiconductor chip on which elements of said PLL circuit are formed, said resistive element is constructed by a plurality of elements having different resistance values, and any of the resistive elements is selectively connected,
    wherein the semiconductor integrated circuit further comprises a correcting circuit for changing current of said charge pump circuit in accordance with the selection of said resistive element, and
    wherein said charge pump circuit comprises a plurality of resistive elements having different resistance values, and said change in current is performed by selecting any of said resistive elements in the charge pump circuit.

2. The semiconductor integrated circuit with a PLL circuit according to claim 1,
wherein when a resistive element having a small resistance value is selected in said loop filter, a resistive element having a small resistance value is selected also in said charge pump circuit, and when a resistive element having a large resistance value is selected in said loop filter, a resistive element having a large resistance value is selected also in said charge pump circuit.

3. The semiconductor integrated circuit with a PLL circuit according to claim 1, further comprising:
a current circuit having a resistive element and outputting current according to a resistance value of the resistive element;
a capacitive element charged by the current circuit; and
a voltage comparator for comparing a charge voltage of the capacitive element with a predetermined potential,
wherein a manufacture variation detector for detecting a manufacture variation from a change in the charge voltage of said capacitive element is provided, and according to a result of detection of the manufacture variation detector, selection of said resistive element is determined.

4. The semiconductor integrated circuit with a PLL circuit according to claim 1,
wherein said loop filter is a second-order filter, and
wherein said resistive element constructed by said plurality of elements having said different resistance values and said capacitive element construct a first-order filter circuit.

5. The semiconductor integrated circuit with a PLL circuit according to claim 1,
wherein said semiconductor integrated circuit is a semiconductor integrated circuit for communication having a reception circuit for down-converting a reception signal to a signal of a lower frequency by combining the reception signal with a signal having a predetermined frequency, said PLL circuit is provided to generate said signal having the predetermined frequency, and a phase comparator as a component of the PLL circuit is a digital circuit.

6. The semiconductor integrated circuit with a PLL circuit according to claim 1,
wherein said semiconductor integrated circuit is a semiconductor integrated circuit for communication having a transmission circuit for up-converting a transmission signal, and including a voltage-controlled oscillator for generating an output transmission signal, and
wherein a phase comparator as a component of the PLL circuit for transmission is an analog circuit.

7. The semiconductor integrated circuit with a PLL circuit according to any one of claim 6, wherein said manufacture variation detector is provided as a circuit common to a PLL circuit for generating a signal having a predetermined frequency which is supplied to said reception circuit, and to said PLL circuit for transmission.

8. The semiconductor integrated circuit with a PLL circuit according to claim 7, wherein said PLL circuit for transmission combines a signal having said predetermined frequency generated by said PLL circuit for generating a signal having said predetermined frequency with an output signal of said voltage-controlled oscillator as a component of said PLL circuit for transmission, thereby generating a signal having a frequency corresponding to the frequency difference, compares the phase of the generated signal with the phase of a transmission signal of an intermediate frequency by a phase comparator as a component of said PLL circuit for transmission, and supplies a signal according to the phase difference to a charge pump.

9. A semiconductor integrated circuit with a PLL circuit, comprising:
a voltage-controlled oscillator;
a phase comparator for comparing a phase of an oscillation signal generated by the voltage-controlled oscillator with a phase of a reference signal and generating a signal according to a phase difference thereof;
a charge pump circuit operated by the signal generated by the phase comparator;
a loon filter for smoothing an output of the charge pump circuit, the voltage smoothed by the loop filter being supplied to said voltage-controlled oscillator to control an oscillation frequency,
a current circuit having a resistive element and outputting current according to a resistance value of the resistive element;
a capacitive element charged by the current circuit; and
a voltage comparator for comparing a charge voltage of the capacitive element with a predetermined potential,
wherein a resistive element and a capacitive element as components of said loop filter are formed over a semiconductor chip on which elements of said PLL circuit are formed, said resistive element is constructed by a plurality of elements having different resistance values, and any of the resistive elements is selectively connected,
wherein the semiconductor integrated circuit further comprises a correcting circuit for changing current of said charge pump circuit in accordance with the selection of said resistive element, and
wherein a manufacture variation detector for detecting a manufacture variation from a change in the charge voltage of said capacitive element is provided, and according to a result of detection of the manufacture variation detector, selection of said resistive element is determined.

10. The semiconductor integrated circuit with a PLL circuit according to claim 9,
wherein said charge pump circuit comprises a plurality of resistive elements having different resistance values, and said change in current is performed by selecting any of said resistive elements in the charge pump circuit, and
wherein when a resistive element having a small resistance value is selected in said loop filter, a resistive element having a small resistance value is selected also in said charge pump circuit, and when a resistive element having a large resistance value is selected in said loop filter, a resistive element having a large resistance value is selected also in said charge pump circuit.

* * * * *